(12) United States Patent
Kim et al.

(10) Patent No.: US 10,511,148 B2
(45) Date of Patent: Dec. 17, 2019

(54) TUNABLE LASER DEVICE

(71) Applicant: SAMSUNG ELECTRONICS CO., LTD., Suwon-si (KR)

(72) Inventors: Jineun Kim, Suwon-si (KR); Unjeong Kim, Osan-si (KR); Hyochul Kim, Yongin-si (KR); Yeonsang Park, Seoul (KR); Moonil Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/941,823

(22) Filed: Mar. 30, 2018

(65) Prior Publication Data

US 2019/0115723 A1   Apr. 18, 2019

(30) Foreign Application Priority Data

Oct. 12, 2017   (KR) .................. 10-2017-0132751

(51) Int. Cl.
| | | |
|---|---|---|
| *H01S 5/183* | (2006.01) | |
| *H01S 5/026* | (2006.01) | |
| *H01S 5/068* | (2006.01) | |
| *H01S 5/06* | (2006.01) | |
| *H01S 5/343* | (2006.01) | |
| *H01S 5/04* | (2006.01) | |

(52) U.S. Cl.
CPC .......... *H01S 5/18302* (2013.01); *H01S 5/026* (2013.01); *H01S 5/068* (2013.01); *H01S 5/0612* (2013.01); *H01S 5/18361* (2013.01); *H01S 5/041* (2013.01); *H01S 5/0614* (2013.01); *H01S 5/18369* (2013.01); *H01S 5/343* (2013.01)

(58) Field of Classification Search
CPC ...... H01S 5/18302; H01S 5/068; H01S 5/041; H01S 5/026; H01S 5/18361; H01S 5/343
See application file for complete search history.

(56) References Cited

U.S. PATENT DOCUMENTS

| | | | |
|---|---|---|---|
| 9,379,520 B2 | 6/2016 | Nagatomo | |
| 2003/0081642 A1* | 5/2003 | Hwang | H01S 5/18341 372/45.01 |
| 2004/0028092 A1 | 2/2004 | Kim | |
| 2006/0203870 A1* | 9/2006 | Kim | H01S 5/141 372/43.01 |
| 2012/0218619 A1* | 8/2012 | Inoue | G02F 1/03 359/263 |
| 2013/0163621 A1 | 6/2013 | Yoon et al. | |
| 2013/0182730 A1 | 7/2013 | Fan et al. | |

(Continued)

FOREIGN PATENT DOCUMENTS

| | | |
|---|---|---|
| JP | 2016-018971 A | 2/2016 |
| JP | 2016-162828 A | 9/2016 |

(Continued)

*Primary Examiner* — Yuanda Zhang
(74) *Attorney, Agent, or Firm* — Sughrue Mion, PLLC

(57) ABSTRACT

A tunable laser device is provided. The tunable laser device includes an active layer configured to generate first light by a first source; first and second reflective layers spaced apart from each other having the active layer disposed between the first reflective layer and the second reflective layer to form a resonance cavity; and a variable refractive index unit in the resonance cavity and having a refractive index being variable according to a second source, the second source being different from the first source.

19 Claims, 9 Drawing Sheets

(56) References Cited

U.S. PATENT DOCUMENTS

2016/0033397 A1 2/2016 Bond et al.
2016/0056613 A1 2/2016 Makino et al.

FOREIGN PATENT DOCUMENTS

| KR | 10-1124171 B1 | 3/2012 |
| KR | 10-2013-0072697 A | 7/2013 |
| KR | 10-2015-0000350 A | 1/2015 |

* cited by examiner

TUNABLE LASER DEVICE

CROSS-REFERENCE TO RELATED APPLICATION

This application claims priority to and the benefit of Korean Patent Application No. 10-2017-0132751, filed on Oct. 12, 2017, in the Korean Intellectual Property Office, the disclosure of which is incorporated herein by reference in its entirety.

BACKGROUND

1. Field

The present disclosure relates to a tunable laser device capable of adjusting a wavelength of emitted light.

2. Description of the Related Art

Since vertical cavity surface emitting lasers (VCSELs) emit a Gaussian beam in a stacking direction of a semiconductor material layer, unlike corner emitting lasers, the VCSELs do not require an optical system for correcting a shape of emitted light. Since a size of the optical system may be reduced, a plurality of VCSELs may be integrated on one semiconductor wafer, and thus, a two-dimensional arrangement is easy. Because of this advantage, VCSELs may be widely applied in the optical application field such as the optical communication field, an electronic calculator, a sound image device, a laser printer, a laser scanner, medical equipment, etc.

Meanwhile, since VCSELs determine a wavelength of emitted light according to a material, it is difficult to apply one laser device to various objects or fields.

SUMMARY

Provided are tunable laser devices capable of selectively adjusting a wavelength of emitted light.

Additional aspects will be set forth in part in the description which follows and, in part, will be apparent from the description, or may be learned by practice of the presented example embodiments.

According to an aspect of an example embodiment, a tunable laser device may include an active layer configured to generate first light by a first source; a first reflective layer and a second reflective layer spaced apart from each other and having the active layer disposed between the first reflective layer and the second reflective layer to form a resonance cavity; and a variable refractive index unit in the resonance cavity and having a refractive index being variable according to a second source, the second source being different from the first source.

A wavelength of second light resonated in the resonance cavity among the first light generated in the active layer may vary according to the refractive index of the variable refractive index unit.

The first source may include at least one of an optical signal and third light.

The second source may include at least one of heat, fourth light, and an electrical signal.

The variable refractive index unit may include a material having the refractive index being variable according to the second source.

The material may include at least one of $LiNbO_3$, $LiTaO_3$, potassium tantalate niobate (KTN), lead zirconate titanate (PZT), $VO_2$, $V_2O_3$, EuO, MnO, CoO, $CoO_2$, $LiCoO_2$, $Ca_2RuO_4$, TbFeCo, GaSb, InSb, InSe, GeSbTe, AgInSbTe, TeGeSbS, InSbTe, SbTe, SnSbTe, InSbGe, and GeTe.

The variable refractive index unit may be spaced apart from the active layer.

The variable refractive index unit may be disposed between the active layer and one of the first and second reflective layers.

The variable refractive index unit may be spaced apart from the first and second reflective layers.

The variable refractive index unit may fill the resonance cavity.

A remaining region of the resonance cavity that excludes the active layer and the variable refractive index unit may be filled with a transparent material.

The transparent material may include at least one of glass and polymethylmethacrylate (PMMA).

A remaining region of the resonance cavity that excludes the active layer and the variable refractive index unit may be filled with a gas.

The tunable laser device further includes: a spacer in the resonance cavity, the spacer being configured to support the active layer and the variable refractive index unit The variable refractive index unit may have a layer shape.

At least a partial region of the active layer may not overlap the variable refractive index unit.

The variable refractive index unit may include one or more openings.

The variable refractive index unit may include a plurality of variable refractive index elements comprising a material having the refractive index being variable according to the second source.

At least two of the plurality of variable refractive index elements may be connected to each other.

A least two of the plurality of variable refractive index elements are spaced apart from each other.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
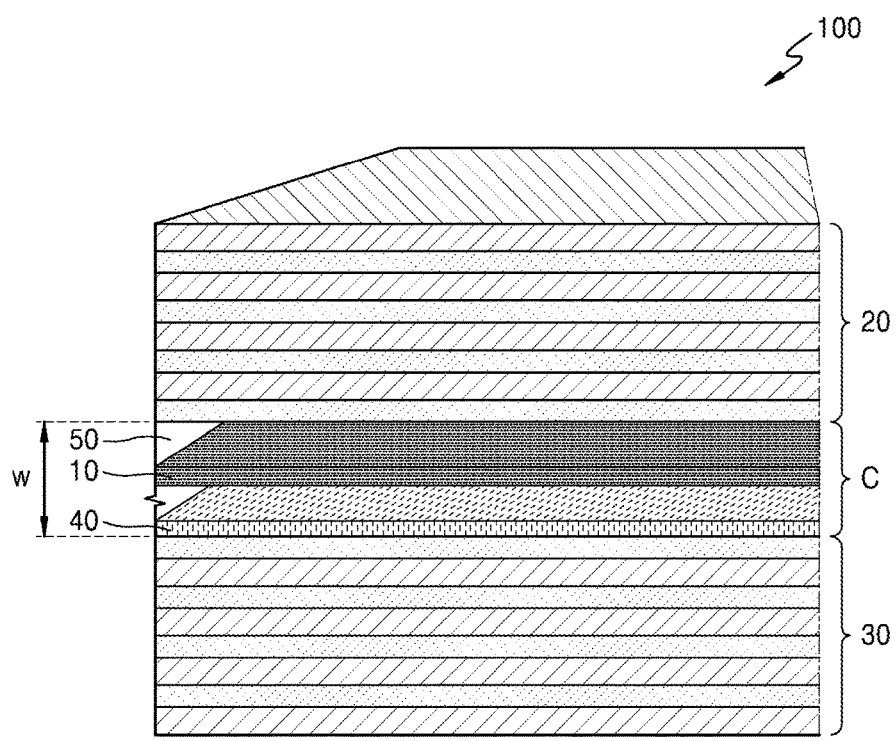
FIG. 1 is a cross-sectional view showing a tunable laser device according to an example embodiment.

Hereinafter, a tunable laser device according to various example embodiments will be described in detail with reference to the accompanying drawings. In the following drawings, like reference numerals refer to like elements, and the size of each element in the drawings may be exaggerated for clarity and convenience of explanation. The terms first, second, etc. may be used to describe various elements, but the elements should not be limited by terms. Terms are used only for the purpose of distinguishing one component from another.

The singular forms "a," "an," and "the" include plural referents unless the context clearly dictates otherwise. Also, when an element is referred to as "comprising," it means that it may include other elements, not necessarily excluding other elements unless specifically stated otherwise. Also, the size and thickness of each component in the drawings may be exaggerated for clarity of explanation. Also, when it is described that a certain material layer is present on a substrate or another layer, the material layer may be present in direct contact with the substrate or another layer, or there may be another third layer therebetween. In the following example embodiments, a described material constituting each layer is merely an example, and other materials may be used.

FIG. 1 is a cross-sectional view showing a tunable laser device 100 according to an example embodiment. Referring to FIG. 1, the tunable laser device 100 may include an active layer 10 for generating light, first and second reflective layers 20 and 30 spaced apart from each other by the active layer 10 therebetween to form a resonance cavity C, and a variable refractive index unit 40 in the resonance cavity C with the first and second reflective layers 20 and 30 and having a varying refractive index. The tunable laser device 100 may operate as a light source by emitting light having a wavelength that resonates in the resonance cavity C among the light generated in the active layer 10. The wavelength resonating in the resonance cavity C may vary according to the refractive index of the variable refractive index unit 40.

The active layer 10 may generate the light by an external source, for example, an optical or electrical signal. The active layer 10 may include a quantum well structure that combines electrons and holes to generate light. The active layer 10 may include a III/V compound semiconductor including group III and group V materials. The active layer 10 may include a resonant periodic gain (RPG) structure including a plurality of quantum well layers and barrier layers between the quantum well layers.

The quantum well layers and the barrier layers alternate with each other and are arranged in a multi-layer structure. Here, a semiconductor material such as $In_xGa_{(1-x)}As_yP_{(1-y)}$, $In_xGa_{(1-x)}As$, $In_xGa_{(1-x)}N_yAs_{(1-y)}$, $In_xGa_{(1-x)}As_ySb$ (where 0.0<x<1.0 and 0.0<y<1.0) may be used as the quantum well layers. Values of x and y may be selected individually with respect to each of the quantum well layers. A quantum dot of In(Ga)(N)As may be used instead of the quantum well layers.

The first and second reflective layers 20 and 30 reflect the light generated in the active layer 10 to the resonance cavity C such that the light may resonate in the resonance cavity C. The first and second reflective layers 20 and 30 may transmit light incident from the outside. The light incident from the outside may be light for generating the light in the active layer 10 or light for changing the refractive index of the variable refractive index unit 40.

The first and second reflective layers 20 and 30 may have a distributed Bragg reflector (DBR) structure designed to have a high reflectance at a resonant wavelength. Reflectivity of the first and second reflective layers 20 and 30 may be equal to approximately 50%. The first and second reflective layers 20 and 30 may be configured as, for example, a multi-band distributed Bragg reflector in which a plurality of different layers are periodically and continuously arranged in a predetermined order. More specifically, each of the first and second reflective layers 20 and 30 is configured by arranging a high refractive index layer H and a low refractive index layer L in a predetermined order. Here, the high refractive index layer H includes $Al_xGa_{(1-x)}As$ (where 0≤x<1) and may include GaAs (that is, x=0), whereas the low refractive index layer L includes $Al_yGa_{(1-y)}As$ (where 0<y≤1) and may include AlAs (that is, y=1).

The first and second reflective layers 20 and 30 may be doped to perform both a function of a reflective layer and a function of an electrical path. For example, the first reflective layer 20 may be doped with n-type impurities, and the second reflective layer 30 may be doped with p-type impurities.

When pumping light is incident on the tunable laser device 100 according to an example embodiment, the active layer 10 is excited by the pumping light to generate light. The generated light travels between the first and second reflective layers 20 and 30 to and from the active layer 10 while repeating reflection. Through this process, the light resonated in the resonance cavity C among the light amplified in the active layer 10 may be emitted to the outside.

The tunable laser device 100 according to an example embodiment may emit light by using electric pumping rather than optical pumping. For example, a first electrode may be further positioned on an upper surface of the first reflective layer 20, and a second electrode may be further positioned on a lower surface of the second reflective layer 30. Like the first reflective layer 20 and the second reflective layer 30, the first electrode may be an n-type doped semiconductor layer, and the second electrode may be a p-type doped semiconductor layer.

The active layer 10 is excited by applying a voltage to each of the first and second electrodes and thus light is generated. The generated light may travel between the first and second reflective layers 20 and 30 to and from the active layer 10 while repeating reflection. The light resonated in the resonance cavity C among the amplified light may be emitted to the outside.

Meanwhile, the variable refractive index unit 40 may be further positioned in the resonance cavity C. The variable refractive index unit 40 may include a material having an optical characteristic varying according to an external source. Here, the external source may be light, an electrical signal, and/or heat. The variable refractive index unit 40 may include, for example, an electro-optic material having a variable refractive index that varies according to the change of its effective permittivity when an electrical signal is applied. For example, a material such as $LiNbO_3$, $LiTaO_3$, potassium tantalate niobate (KTN), lead zirconate titanate (PZT), or the like may be used. Various polymer materials having an electro-optical characteristic may also be used.

The external source is not limited to the electrical signal. A material having a variable permittivity due to a phase transition at a predetermined temperature or higher when heat is applied, for example, $VO_2$, $VO_2O_3$, EuO, MnO, CoO, $CoO_2$, $LiCoO_2$, or $Ca_2RuO_4$, etc. may be employed in the variable refractive index unit 40. In addition, the variable refractive index unit 40 may include a material such as TbFeCo, GaSb, InSb, InSe, GeSbTe, AgInSbTe, TeGeSbS, InSbTe, SbTe, SnSbTe, InSbGe, GeTe, etc. and may include a material having a refractive index that varies according to light other than the electrical signal and heat.

One or more pairs of conductive layers for transferring the electrical signal or heat may be further positioned on the variable refractive index unit 40. A pair of conductive layers may be spaced apart from each other on the variable refractive index unit 40. For example, the first conductive layer may be positioned on the lower portion of the variable refractive index unit 40, and the second conductive layer may be positioned on the lower portion of the variable refractive index unit 40. Since the conductive layers are disposed in the resonance cavity C, the conductive layers may include a material having high transmittance. For example, the conductive layers may include a transparent conductive oxide (TCO) such as indium tin oxide (ITO), indium zinc oxide (IZO), aluminum zinc oxide (AZO), and gallium zinc oxide (GZO).

The tunable laser device 100 may include a signal applying member for applying an external signal to induce a change in refractive index. The signal applying member may be a voltage applying member for applying a voltage between the conductive layers in order to form an electric field in the variable refractive index unit 40, but is not limited thereto.

A remaining space 50 of the resonance cavity C may be filled with a material transparent to the light emitted from the active layer 10. For example, the remaining space 50 may be filled with a transparent material such as glass or polymethylmethacrylate (PMMA). The remaining space 50 of the resonance cavity C is smaller than the variable refractive index unit 40 even if there is little or no change in the refractive index as compared with the variable refractive index unit 40, and thus the remaining space 50 may be referred to as a refractive index fixing unit with respect to the variable refractive index unit 40. If the refractive index fixing unit is filled with gas such as air, a spacer for maintaining the space of the resonance cavity C may be further positioned.

As shown in FIG. 1, the variable refractive index unit 40 may be spaced apart from the active layer 10. For example, the variable refractive index unit 40 may be in contact with the first reflective layer 20. The material of the variable refractive index unit 40 having the varying refractive index may vary in volume because the refractive index thereof varies. The variable refractive index unit 40 and the active layer 10 are spaced apart from each other, and thus the active layer 10 may reduce an influence of the refractive index variation of the variable refractive index unit 40.

The active layer 10 and the first and second reflective layers 20 and 30 may include materials capable of emitting or reflecting light of a relatively wide wavelength. Meanwhile, the tunable laser device 100 may amplify and emit light of a specific wavelength having a narrow wavelength band due to a resonance condition of the resonance cavity C. The light emitted from the tunable laser device 100 may be determined by a resonance wavelength of the resonance cavity C. The resonance wavelength may be determined by a resonance length. The resonance length may be determined by a width w of the resonance cavity C and an effective permittivity of the resonance cavity C and the like. The effective permittivity in the resonance cavity C may be changed according to the refractive index of the variable refractive index unit 40. Therefore, an optical path in the resonance cavity C may be changed by varying the refractive index of the variable refractive index unit 40, thereby changing the resonance wavelength.

Since the tunable laser device 100 according to an example embodiment emits light of different wavelengths according to the refractive index of the variable refractive index unit 40, the tunable laser device 100 may selectively emit light of various wavelengths through one laser device. One laser device may be applied to various fields. In particular, when analyzing a characteristic of a material by using light, background noise may be efficiently removed by using different wavelengths emitted from one laser device.

Figure 2:
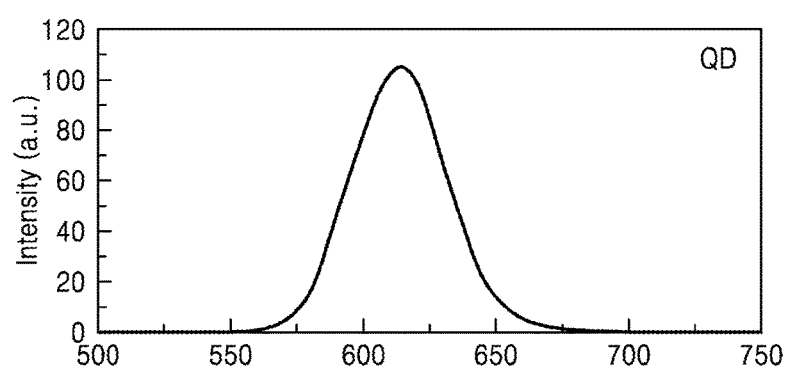
FIG. 2 illustrates a result showing a wavelength of light generated in an active layer.
Figure 3:
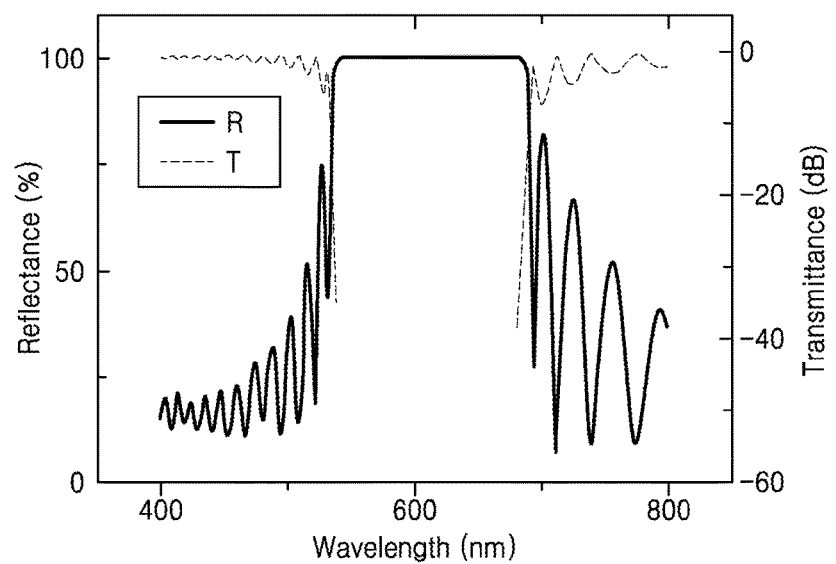
FIG. 3 is a graph showing a refractive index and transmittance of a reflective layer.

FIG. 2 illustrates a result showing a wavelength of light generated in the active layer 10. FIG. 3 is a graph showing a refractive index and transmittance of a reflective layer. A quantum dot is used as the active layer 10. The reflective layer has a DBR structure including $TiO_2/SiO_2$. As shown in FIG. 2, it may be confirmed that light having a wide wavelength band is generated in the active layer 10. Also, as shown in FIG. 3, it may be seen that the reflective layer has a remarkably high reflectance of a specific wavelength band.

Figure 4:
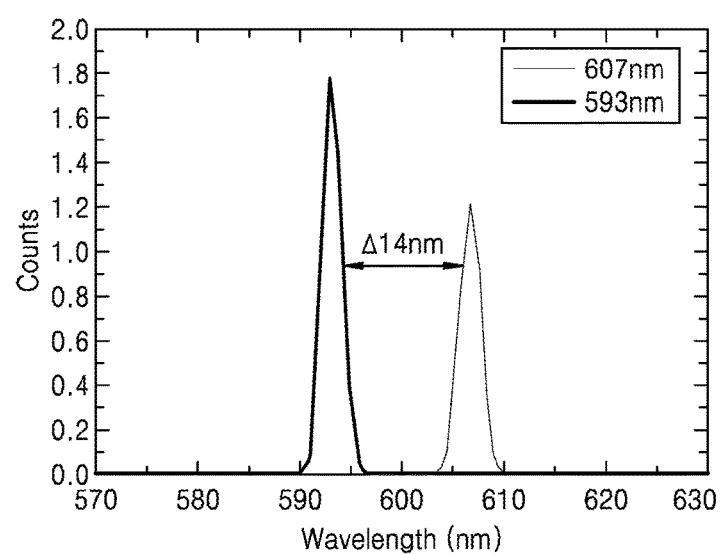
FIG. 4 is a graph illustrating a simulation result of a wavelength of emitted light according to a refractive index change.

FIG. 4 illustrates a simulation result of a wavelength of emitted light according to a refractive index change. A quantum dot is used as the active layer 10 of the tunable laser device 100. $VO_2$ is used as a material of the variable refractive index unit 40. The first and second reflective layers 30 have a DBR structure including $TiO_2/SiO_2$. As shown in FIG. 4, light of 592 nm is emitted when $VO_2$ is in a metal phase, while light of 607 nm is emitted when $VO_2$ is in a semiconductor phase. That is, it may be confirmed that the wavelength of the emitted light varies according to the refractive index of the variable refractive index unit 40.

Figure 5A:
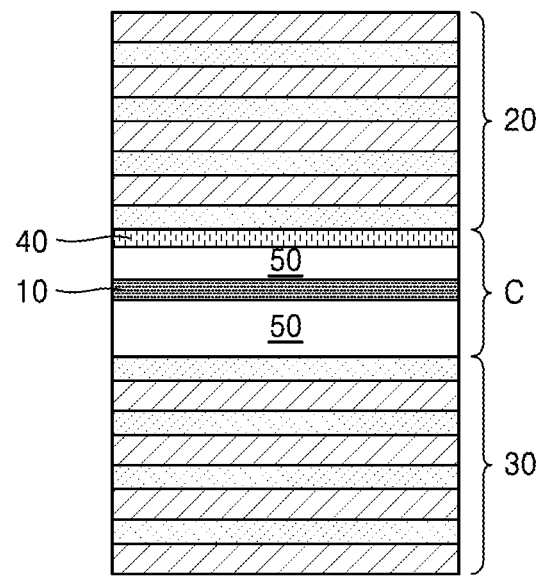
FIGS. 5A to 5F are diagrams of various arrangements of a variable refractive index unit.
Figure 5B:
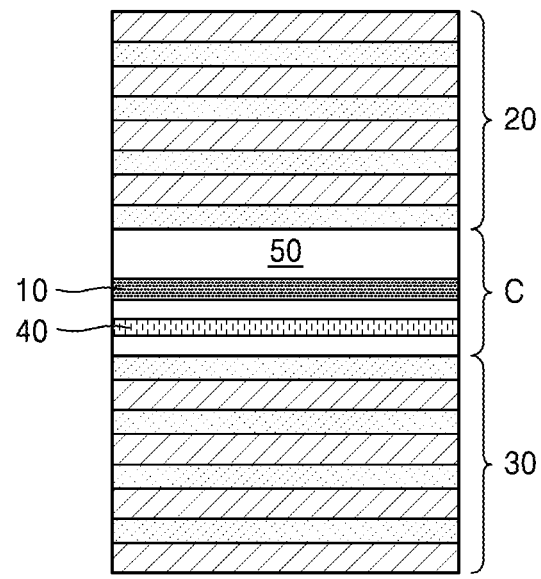
Figure 5C:
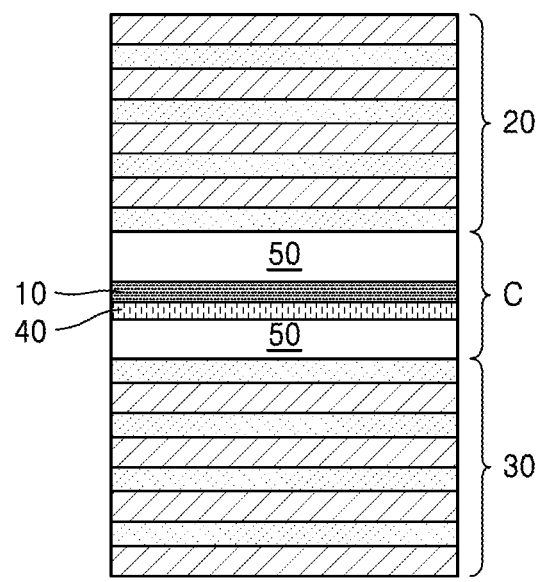
Figure 5D:
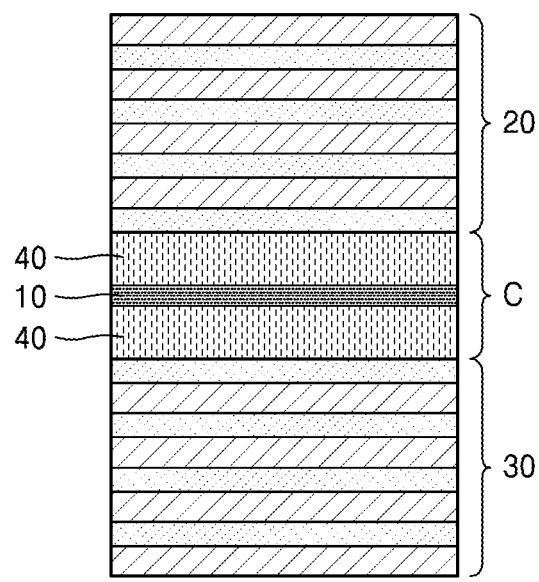

FIGS. 5A to 5F are diagrams of various arrangements of the variable refractive index unit 40. As shown in FIG. 5A, the variable refractive index unit 40 may be positioned on a lower surface of the first reflective layer 20. Alternatively, as shown in FIG. 5B, the variable refractive index unit 40 may be spaced apart from the active layer 10 and may be spaced apart from the first and second reflective layers 20 and 30. An influence on a reflective layer according to a refractive index variation of the variable refractive index unit 40 may be reduced. Alternatively, as shown in FIG. 5C, it is not excluded that the variable refractive index unit 40 is in contact with the active layer 10. As shown in FIG. 5D, the variable refractive index unit 40 may fill a space of the resonance cavity C. The wider the region occupied by the variable refractive index unit 40 in the resonance cavity C, the greater the refractive index variation. Thus, since a range of a resonance wavelength in the resonance cavity C increases, a tuning range of the tunable laser device 100 may also increase.

Figure 5E:
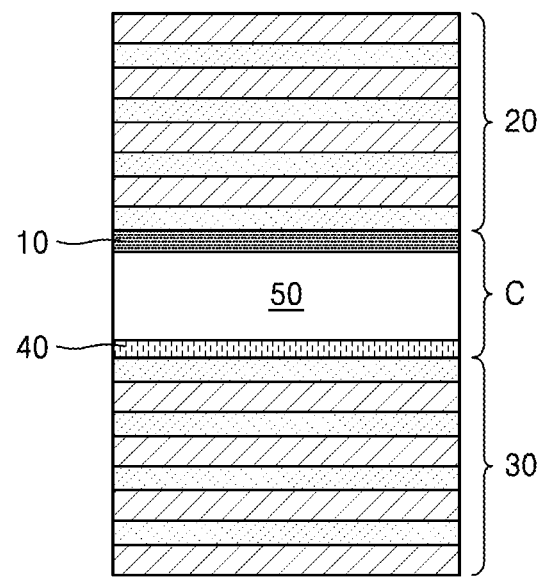
Figure 5F:
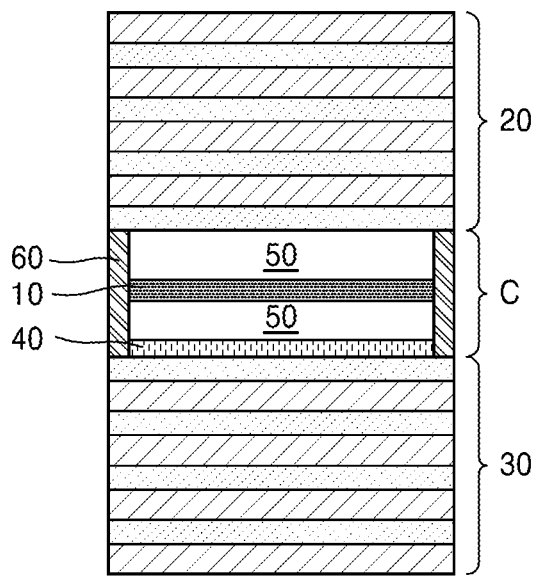

Alternatively, as shown in FIG. 5E, the active layer 10 may be in contact with a lower surface of the first reflective layer 20, and the variable refractive index unit 40 may be positioned on an upper surface of the second reflective layer 30. As shown in FIG. 5F, the tunable laser device may further include a spacer 60 for supporting the resonance cavity C. The space 50 of the resonance cavity C, except for the active layer 10 and the variable refractive index unit 40, by including the spacer 60 may be filled with gas such as air or the like. The spacer 60 may include a transparent material, for example, glass or PMMA.

Up to this point, the variable refractive index unit 40 is shown as one layer, but is not limited thereto. The variable refractive index unit 40 may include a plurality of layers. The plurality of layers may be in contact with each other or spaced apart from each other. Further, the variable refractive index unit 40 may have a structure other than the layers.

Figure 6A:
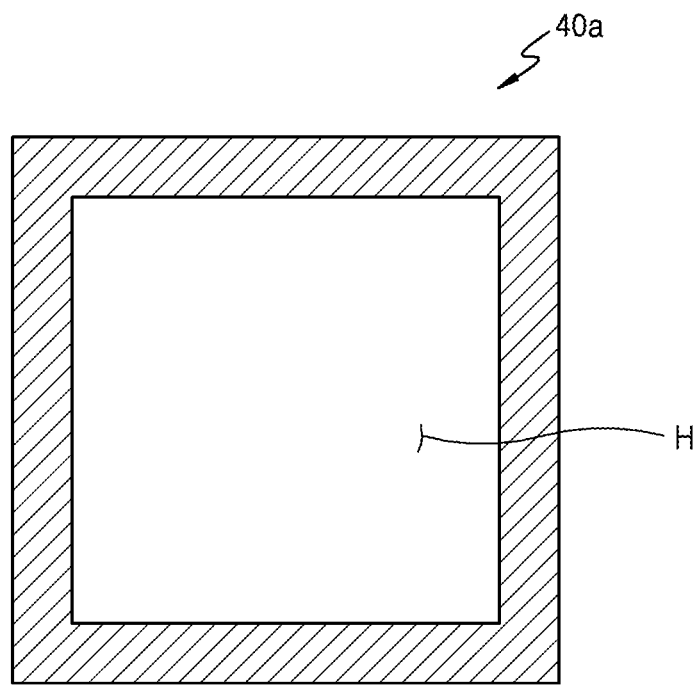
FIGS. 6A and 6B illustrate variable refractive index units each including one or more openings according to an example embodiment.
Figure 6B:
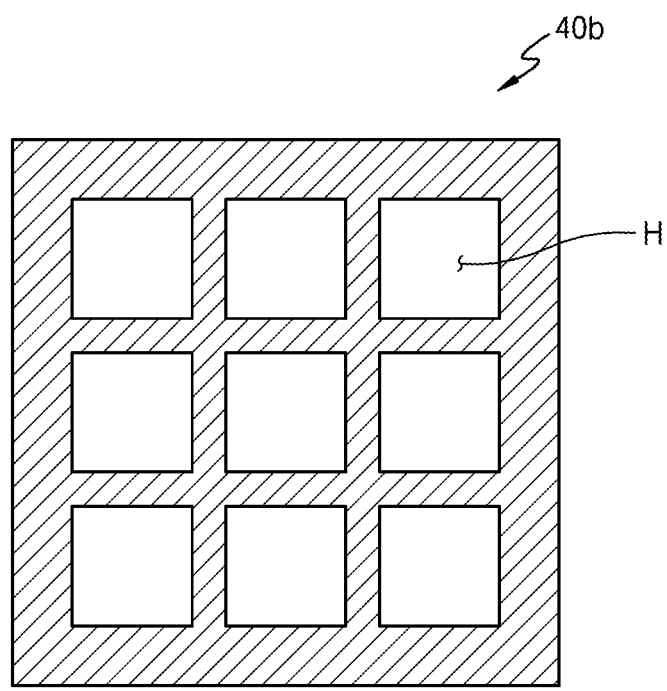

FIGS. 6A and 6B illustrate variable refractive index units 40a and 40b each including one or more openings H according to an example embodiment. As shown in FIG. 6A, the variable refractive index unit 40a may have a ring shape in which a center region is empty. Thus, a partial region of the active layer 10 may not overlap with the variable refractive index unit 40a. The openings H may be formed in the active layer 10 on an optical path of pumping light or emitted light. Thus, optical loss may be reduced by the variable refractive index unit 40a. Alternatively, as shown in FIG. 6B, the variable refractive index unit 40b may have a mesh structure including the plurality of openings H. In FIGS. 6A and 6B, the openings H are shown as squares, but are not limited thereto. The openings H may have various shapes such as a polygon such as a triangle, a pentagon, etc., a circle, an ellipse, and the like. The openings H included in the refractive index varying units 40a and 40b may result in a reduction in an influence of a volume change due to a refractive index variation of the variable refractive index units 40a and 40b on other layers such as the active layer 10, etc.

Figure 7A:
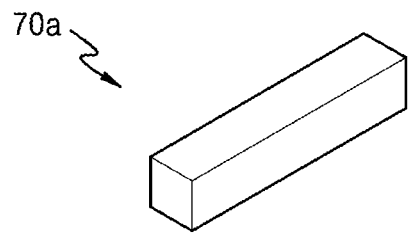
FIGS. 7A to 7D illustrate variable refractive index elements of various shapes.
Figure 7B:
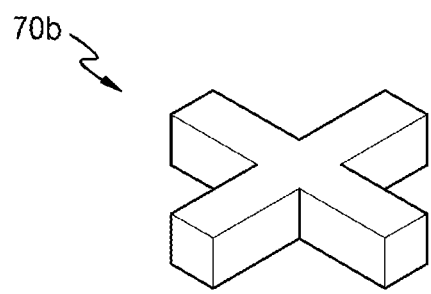
Figure 7C:
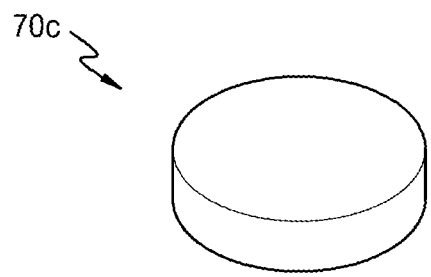
Figure 7D:
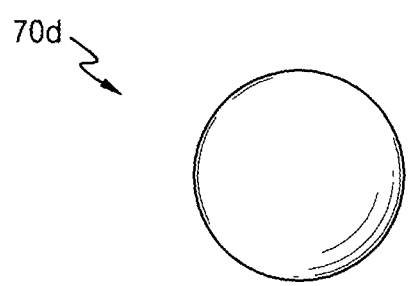

The variable refractive index unit 40 may include a plurality of variable refractive index elements. FIGS. 7A to 7D illustrate variable refractive index elements of various shapes. The variable refractive index elements may include a material having a refractive index varying according to an external source and, as shown in FIGS. 7A through 7C, may include a polyhedron such as a rod shape 70a or a cross shape 70b, etc. or a columnar shape such as a cylindrical shape 70c, etc. Alternatively, as shown in FIG. 7D, the variable refractive index elements may have a spherical shape 70d. The variable refractive index elements may have various shapes other than the above-described shapes. The variable refractive index elements 70a, 70b, 70c and 70d may be arranged one-dimensionally or two-dimensionally in the resonance cavity C, and may be randomly arranged. Further, at least two of the variable refractive index elements may be connected to each other, or may be spaced apart from each other.

Although the above-described tunable laser device has been described with reference to the example embodiments shown in the drawings, it should be understood that the embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A tunable laser device comprising:
   an active layer configured to generate first light by a first source;
   a first reflective layer and a second reflective layer spaced apart from each other and having the active layer disposed between the first reflective layer and the second reflective layer to form a resonance cavity; and
   a variable refractive index unit disposed in the resonance cavity and having a refractive index being variable according to a second source, the second source being different from the first source;
   a spacer in the resonance cavity, the spacer being disposed on each side of the active layer and the variable refractive index unit, respectively,
   wherein a wavelength of second light resonated in the resonance cavity among the first light generated in the active layer varies according to the refractive index of the variable refractive index unit.

2. The tunable laser device of claim 1, wherein the first source comprises at least one of an optical signal and third light.

3. The tunable laser device of claim 1, wherein the second source comprises at least one of heat, fourth light, and an electrical signal.

4. The tunable laser device of claim 1, wherein the variable refractive index unit comprises a material having the refractive index being variable according to the second source.

5. The tunable laser device of claim 4, wherein the material comprises at least one of LiNbO3, LiTaO3, potassium tantalate niobate (KTN), lead zirconate titanate (PZT), VO2, VO2O3, EuO, MnO, CoO, CoO2, LiCoO2, Ca2RuO4, TbFeCo, GaSb, InSb, InSe, GeSbTe, AgInSbTe, TeGeSbS, InSbTe, SbTe, SnSbTe, InSbGe, and GeTe.

6. The tunable laser device of claim 1, wherein the variable refractive index unit is spaced apart from the active layer.

7. The tunable laser device of claim 1, wherein the variable refractive index unit is disposed between the active layer and one of the first and second reflective layers.

8. The tunable laser device of claim 1, wherein the variable refractive index unit is spaced apart from the first and second reflective layers.

9. The tunable laser device of claim 1, wherein the variable refractive index unit fills the resonance cavity.

10. The tunable laser device of claim 1, wherein a remaining region of the resonance cavity that excludes the active layer and the variable refractive index unit is filled with a transparent material.

11. The tunable laser device of claim 10, wherein the transparent material comprises at least one of glass and polymethylmethacrylate (PMMA).

12. The tunable laser device of claim 1, wherein a remaining region of the resonance cavity that excludes the active layer and the variable refractive index unit is filled with a gas.

13. The tunable laser device of claim 12, wherein the spacer is configured to support the active layer and the variable refractive index unit.

14. The tunable laser device of claim 1, wherein the variable refractive index unit has a layer shape.

15. The tunable laser device of claim 1, wherein at least a partial region of the active layer does not overlap the variable refractive index unit.

16. The tunable laser device of claim 1, wherein the variable refractive index unit comprises one or more openings.

17. The tunable laser device of claim 1, wherein the variable refractive index unit comprises a plurality of variable refractive index elements comprising a material having the refractive index being variable according to the second source.

18. The tunable laser device of claim 17, wherein at least two of the plurality of variable refractive index elements are connected to each other.

19. The tunable laser device of claim 17, wherein at least two of the plurality of variable refractive index elements are spaced apart from each other.

* * * * *